(12) United States Patent
Ito

(10) Patent No.: US 7,710,626 B2
(45) Date of Patent: May 4, 2010

(54) OPTICAL ELEMENT DRIVING APPARATUS

(75) Inventor: Hirohito Ito, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 370 days.

(21) Appl. No.: 11/752,563

(22) Filed: May 23, 2007

(65) Prior Publication Data

US 2007/0280609 A1 Dec. 6, 2007

(30) Foreign Application Priority Data

May 23, 2006 (JP) .............................. 2006-142721

(51) Int. Cl.
*G02B 26/08* (2006.01)
*G02B 26/00* (2006.01)
(52) U.S. Cl. .................. 359/224.1; 359/290; 359/200.8
(58) Field of Classification Search ................. 359/198, 359/223, 224, 290–292, 315, 814, 824, 846, 359/849, 872, 198.1, 200.6, 200.7, 200.8, 359/223.1, 224.1
See application file for complete search history.

(56) References Cited

U.S. PATENT DOCUMENTS 6,464,364 B2 * 10/2002 Graves et al. ............... 359/846
6,788,386 B2 9/2004 Cox
6,842,277 B2 1/2005 Watson

FOREIGN PATENT DOCUMENTS

JP 2003-203860 7/2003
JP 2004-64076 2/2004

* cited by examiner

*Primary Examiner*—William C Choi
(74) *Attorney, Agent, or Firm*—Canon U.S.A. Inc., IP Division

(57) ABSTRACT

At least one exemplary embodiment is directed to an optical element driving apparatus which includes a first actuator configured to drive an optical element in accordance with a deformation target value, a sensor arranged to measure a position and an orientation of the optical element, a second actuator configured to drive the optical element in accordance with position and orientation target values and an output of the sensor, and a correcting unit configured to correct a measurement error of the sensor caused by deformation of the optical element.

7 Claims, 13 Drawing Sheets

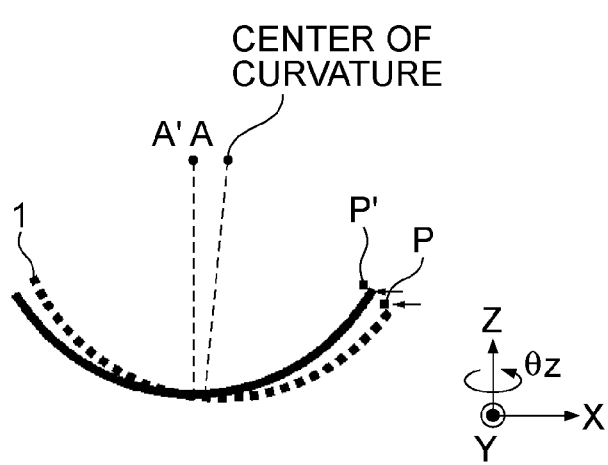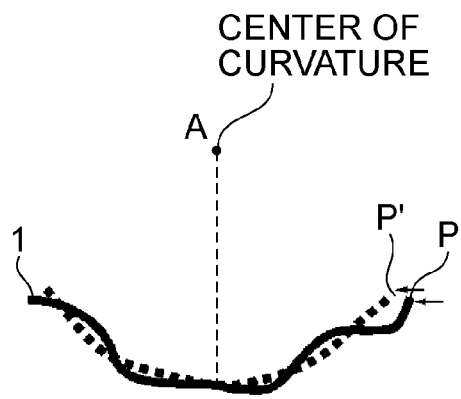

OPTICAL ELEMENT DRIVING APPARATUS

BACKGROUND OF THE INVENTION

1. Field of the Invention

The present invention relates to an optical element driving apparatus. In particular, though not exclusively, the present invention can be applied to an optical element used in an exposure apparatus.

2. Description of the Related Art

As an optical element driving apparatus for driving an optical element, Japanese Patent Laid-Open No. 2003-203860 (corresponding to U.S. Pat. No. 6,788,386) discusses a technique of positioning the optical element with six degrees of freedom by an actuator. Japanese Patent Laid-Open No. 2003-203860 also discusses that the optical element driving apparatus further includes a sensor and an actuator to constitute a control loop for the purpose of correcting a local mirror surface defect.

Japanese Patent Laid-Open No. 2004-64076 (corresponding to U.S. Pat. No. 6,842,277) discusses a technique of performing position adjustment of a deformable mirror through servo control of a force actuator for driving the deformable mirror and a position sensor for measuring a contact point of the force actuator with the deformable mirror.

FIG. 14 is a block diagram of a control system 40 in an optical element driving apparatus discussed in Japanese Patent Laid-Open No. 2004-64076. A control command given to an actuator 30 is decided by a controller 45 to make the position of the deformable mirror, which is determined from a measured value of the position sensor 42, matched with a predetermined position target value. In accordance with the control command, the mirror is driven so that the mirror position determined from the measured value of the position sensor is matched with the predetermined position target value.

In the optical element like the above-mentioned deformable mirror, there is a possibility that, depending on the arrangement of measurement points of the position sensors each of which measures the position of the optical element, the measured value of the position sensor may include both a rigidity displacement and an amount of deformation of the optical element, which are caused by the influence of deformation of the optical element. In such a case, the optical element cannot be controlled to an accurate position even when the position of the optical element is controlled using the measured values of the position sensors.

SUMMARY OF THE INVENTION

At least one exemplary embodiment of the present invention is directed to a driving apparatus for controlling a position of an optical element with high accuracy.

At least one exemplary embodiment of the present invention is directed to an optical element driving apparatus including a first actuator configured to drive an optical element in accordance with a deformation target value, a sensor arranged to measure a position and an orientation of the optical element, a second actuator configured to drive the optical element in accordance with a position and an orientation target values and an output of the sensor, and a correcting unit configured to correct a measurement error of the sensor caused by deformation of the optical element.

At least one further exemplary embodiment of the present invention is directed to an optical element driving apparatus including a first actuator configured to drive an optical element in accordance with a deformation target value, a sensor arranged to measure a position and an orientation of the optical element, and a second actuator configured to drive the optical element in accordance with a position and an orientation target values and an output of the sensor, where the sensor is arranged depending on a deformed shape of the optical element, the deformed shape being obtained in advance.

According to at least one exemplary embodiment of the present invention, in the optical element driving apparatus, by correcting the measured value of the position sensor or the position and orientation target values of the optical element depending on the deformed shape of the optical element, or by arranging the position sensor at a location not affected by the deformation of the optical element, the optical element can be positioned to a predetermined position and a predetermined orientation with high accuracy even when the optical element is deformed, without being affected by the deformation.

Further features of the present invention will become apparent from the following description of exemplary embodiments with reference to the attached drawings.

BRIEF DESCRIPTION OF THE DRAWINGS

FIGS. 2A and 2B are schematic views for explaining measurement of the position of an optical element.

DESCRIPTION OF THE EMBODIMENTS

Figure 1:
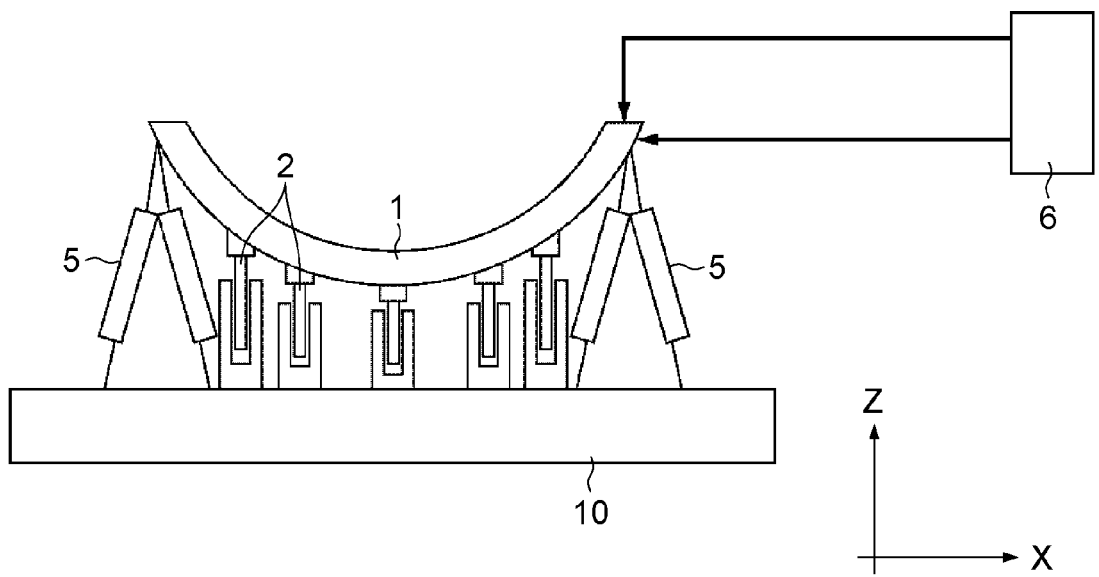
FIG. 1 is a schematic view of an optical element driving apparatus according to a first exemplary embodiment.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example the fabrication of the optical element and the actuators.

Notice that similar reference numerals and letters refer to similar items in the following figures, and thus once an item is defined in one figure, it may not be discussed for following figures.

Note that herein when referring to correcting or corrections of an error (e.g., a measurement error), a reduction of the error and/or a correction of the error is intended.

First Exemplary Embodiment

FIG. 1 is a schematic view of an optical element driving apparatus according to a first exemplary embodiment. Referring to FIG. 1, a driving apparatus configured to drive an optical element 1 comprising a plurality of actuators 2 configured to deform the optical element 1, a plurality of actuators 5 configured to control the position and the orientation of the optical element 1, a position sensor 6 configured to measure the position and the orientation of the optical element 1. The actuators 2 and 5 are supported by a supporting member 10 having a reference surface. The reference surface can be used as a reference for measuring the position and the orientation of the optical element 1. While in this first exemplary embodiment the position sensor 6 directly measures the position and the orientation of the optical element 1, the position and the orientation of the optical element 1 can also be indirectly measured by measuring a member supporting the optical element.

While in this first exemplary embodiment a concave reflective mirror having a spherical shape is used, by way of example, as the optical element 1, the usable mirror is not limited to such a shape, and a lens can also be used instead of the mirror.

The optical element 1 can be deformed into an arbitrary shape by the actuators 2. Any of various actuators, such as an electromagnet, a linear motor, a pneumatic cylinder, a piezoelectric device, and any other actuator as known by one of the relevant skill in the related art can be used as each of the actuators 2.

The actuator 2 can be controlled in accordance with the measured result of a force sensor or a displacement sensor (not shown). When the electromagnet or the linear motor is used, it can be controlled such that a driver current is held constant.

The position sensor 6 measures a position of the optical element 1 at each of plural points. The actuators 5 perform positioning of the optical element 1 in accordance with each measured value of the position sensor 6. While the position sensor 6 is shown in FIG. 1 as having only two measuring axes, the position sensor 6 can be configured to be able to perform the measurement in six axes of X, Y, Z, θx, θy and θz or in only required axes. An electrostatic capacitance sensor, an interferometer, an encoder, or other non-contact sensor with high accuracy can be used as the position sensor 6.

Any of various actuators, such as an electromagnet, a linear motor, a pneumatic cylinder, and a piezoelectric device, can be used as each of the actuators 5. The actuators 5 can be the same type as the actuators 2.

In the case of a mirror having a spherical surface, the position and the orientation of the mirror can be expressed based on the position of the center of curvature of the spherical surface. The reason is that once the center of curvature is aligned, a reflecting surface of the mirror is the same regardless of physical orientation, and optical parameters, such as a focal position, are also the same. Assuming the direction of an optical axis to be a Z-axis, the position of the center of curvature is not changed even if an angle of rotation θz about the Z-axis is changed. Also, any of inclinations θx and θy with respect to the Z-axis and movements in the directions of X- and Y-axes perpendicular to the Z-axis appears as a shift of the center of curvature in a direction perpendicular to the optical axis.

The position of the center of curvature can be directly measured, and it is enough to make the measurement with only three degrees of freedom of X, Y and Z. In practice, however, displacements at several points on the mirror have to be measured. Therefore, the measurement is made with the five degrees of freedom except for θz, and the position of the center of curvature is obtained through coordinate conversion. For a mirror other than the spherical mirror, the position and the orientation of a point serving as an optical reference can also be similarly obtained through coordinate conversion of the position-sensor measured values.

FIGS. 2A and 2B are schematic views for explaining measurement of the position of an optical element 1 by the position sensor 6. Although the drawings show only one measurement point of the position sensor for the sake of simplification, the following description is similarly applied to the case of using a plurality of sensors.

FIG. 2A represents the case where the optical element 1 is not deformed and only the position/orientation of the optical element 1 is changed. The position of the optical element 1 (indicated by dotted lines) having the center A of curvature is measured at a measurement point P. The center of curvature of the optical element (indicated by solid lines) after change is displaced to A' and the measurement point is also displaced to P'. In this case, because a displacement of the measurement point of the position sensor and a displacement of the center of curvature corresponds to each other in a 1:1 relation, the position of the center of curvature can be accurately obtained from the measured value of the position sensor 6.

On the other hand, FIG. 2B represents the case where the optical element is deformed. In that case, even with the position of the center of curvature not changed, there is a possibility that the measurement point of the position sensor is displaced (P→P') and the measured value of the position sensor is changed. Accordingly, the influence of deformation can be removed from the measured value of the position sensor in order to obtain the accurate position of the center of curvature of the optical element.

Also, the radius of curvature of a spherical surface is sometimes changed with deformation. In such a case, the position of the center of curvature is displaced corresponding to the change in the radius of curvature in spite of the position and the orientation of the optical element being not changed. It is therefore useful to not only to remove the influence of the deformation from the measured value of the position sensor, but also to obtain the position of the center of curvature in consideration of the change in the radius of curvature.

Figure 3:
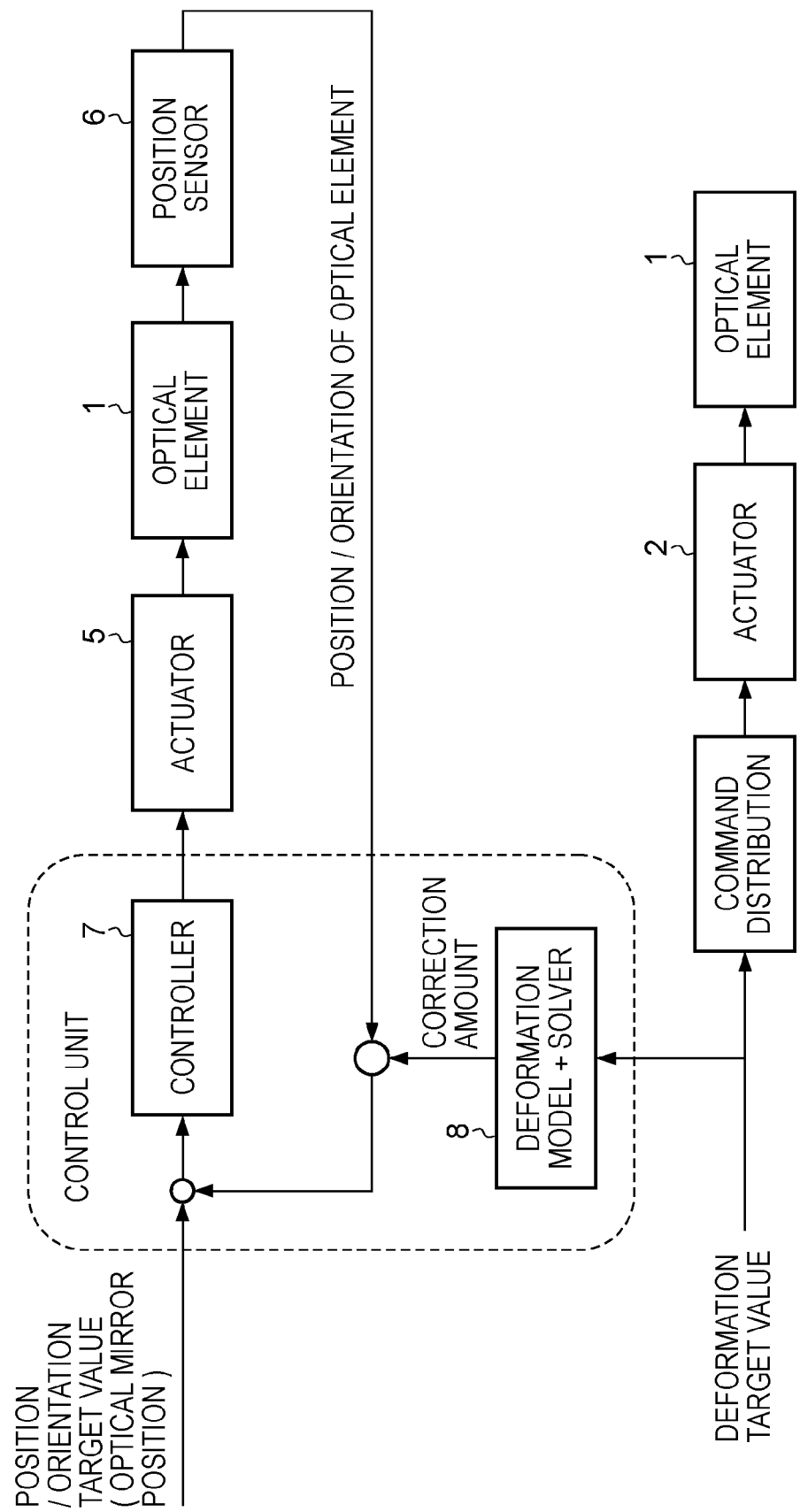
FIG. 3 is a block diagram of a control system in the optical element driving apparatus according to the first exemplary embodiment.

FIG. 3 is a block diagram of a control system in the optical element driving apparatus. In accordance with an input deformation target value, commands for providing required forces (displacements) to be generated are distributed to the actuators 2 so that a predetermined deformed shape is obtained. The actuators 2 generate the forces (displacements) in accordance with respective command values, thus deforming the optical element 1 to a predetermined target shape.

On the other hand, with respect to an input position/orientation target value of the optical element 1, each displacement generating actuator 5 is driven in accordance with a command value which is decided by a controller 7 based on the measured value of the position sensor, whereby the optical element 1 is positioned to a predetermined position and a predetermined orientation. At that time, as described above, the measured value of the position sensor can be corrected depending on the deformed shape. If the deformed shape at the measurement point of the position sensor can be simultaneously measured along with the measured value of the position sensor, the measured value of the position sensor can be corrected using the measured result of the deformed shape. However, it is usually difficult to measure the deformed shape alone.

In view of the above point, this first exemplary embodiment includes a deformation model of the optical element 1 and a solver 8 (computing unit) for computing a displacement of the sensor measurement point based on the deformation model with respect to the deformation target value. Stated another way, a correction amount of the measured value of the position sensor is calculated from the displacement of the measurement point of the position sensor with respect to the input deformed shape by using the solver 8. As a result, one can correct the measured value of the position sensor and to position the optical element 1 to the predetermined position/orientation target value with high accuracy. For example, a finite element model can be used as the deformation model, and a finite element analysis solver can be used as the solver. Using those model and solver also enables the respective command values for the predetermined deformed shape to be distributed to the deforming actuators 2.

An optical element driving method executed by the above-described control system includes a step of computing, based on the deformation target value, an amount of displacement of the sensor measurement point caused by the deformation of the optical element. The optical element driving method further includes a step of correcting the measured value of the position sensor based on the calculated amount of displacement, and a step of controlling a driving mechanism which positions the optical element using the corrected value.

Figure 4:
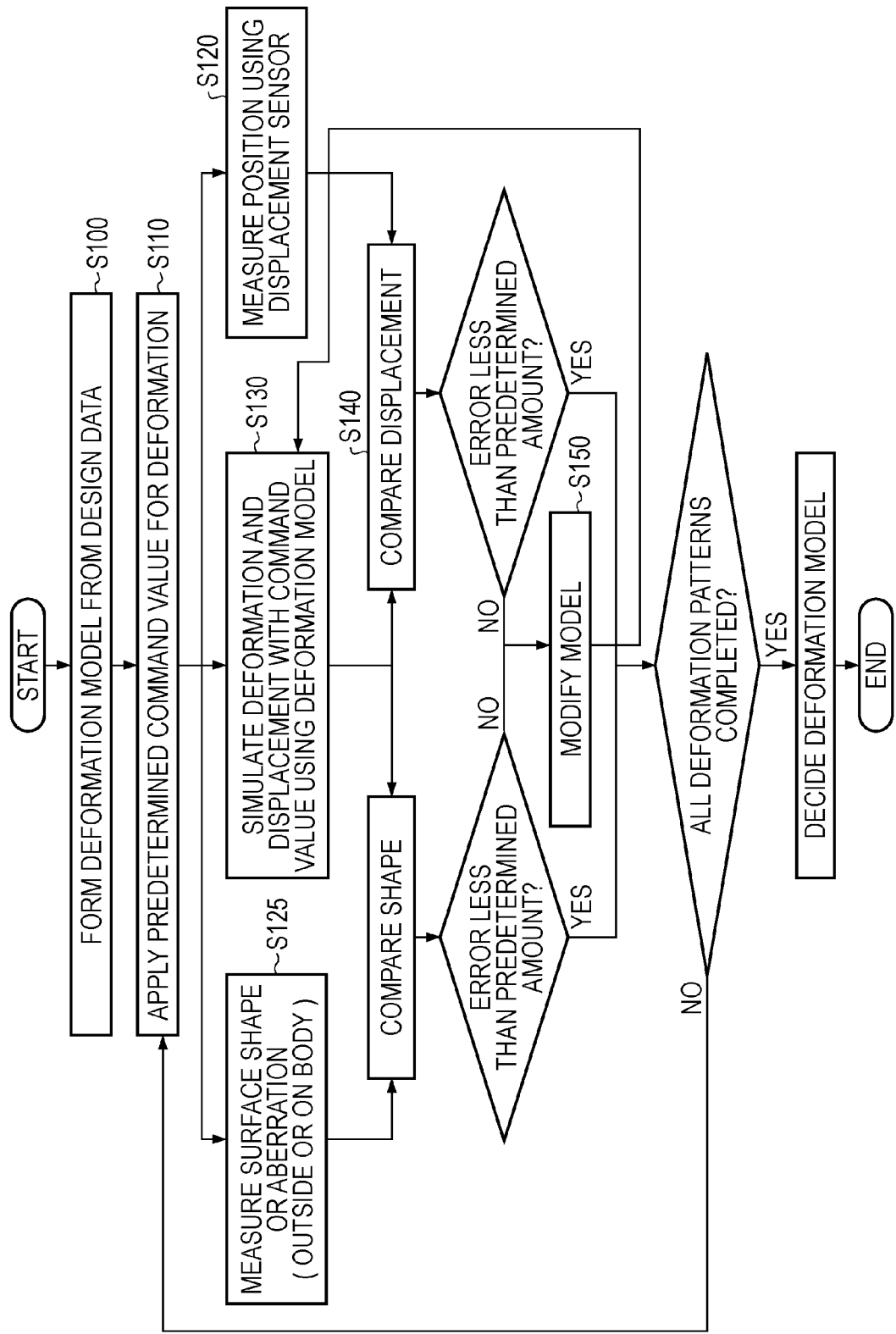
FIG. 4 is a flowchart for a deformation model decision procedure in the optical element driving apparatus according to the first exemplary embodiment.

FIG. 4 is a flowchart for a deformation model decision procedure. In order to position the optical element with high accuracy, it is useful to correct the measured value of the position sensor with high accuracy and to decide the deformation model with high accuracy. The deformation model can be formed from mechanism design data of the optical element 1, etc. (S100). However, because an error occurs between the design data and an actually manufactured optical element, the error is corrected by actually measuring a deformation state. First, a predetermined deformation command value is applied to the optical element driving apparatus (S110), thereby deforming the optical element 1. The measured value of the position sensor in that state is obtained (S120). Then, the same deformation command value is applied to the deformation model for simulation of the deformation state, and the measured value of the position sensor in that state is obtained (S130). While comparing the actually measured value of the position sensor and the simulated value (S140), the deformation model is repeatedly modified (S150) until an error becomes less than a predetermined amount. In addition, the deformation model can also be modified by measuring the deformed shape of the optical element using a surface shape measuring device or a wave-front aberration measuring device (S125), comparing the measured shape with the simulated shape, and repeating the comparison until an error becomes less than a predetermined amount. The surface shape measuring device or the wave-front aberration measuring device can be prepared as a separate inspection device or can be used in common with a similar device built in an exposure apparatus in which is installed the optical element driving apparatus. By repeating the above-described steps for all of shape patterns corresponding to scheduled deformations of the optical element, the deformation model is modified for each of all the deformed shapes so that the error between the simulation result using the deformation model and the actually measured value is less than the predetermined allowable value. Regarding the number of times repeated corresponding to the deformation patterns, an appropriate number of repetitions and patterns are decided in consideration of the required accuracy of the deformation model and the time required for executing the steps.

Figure 5:
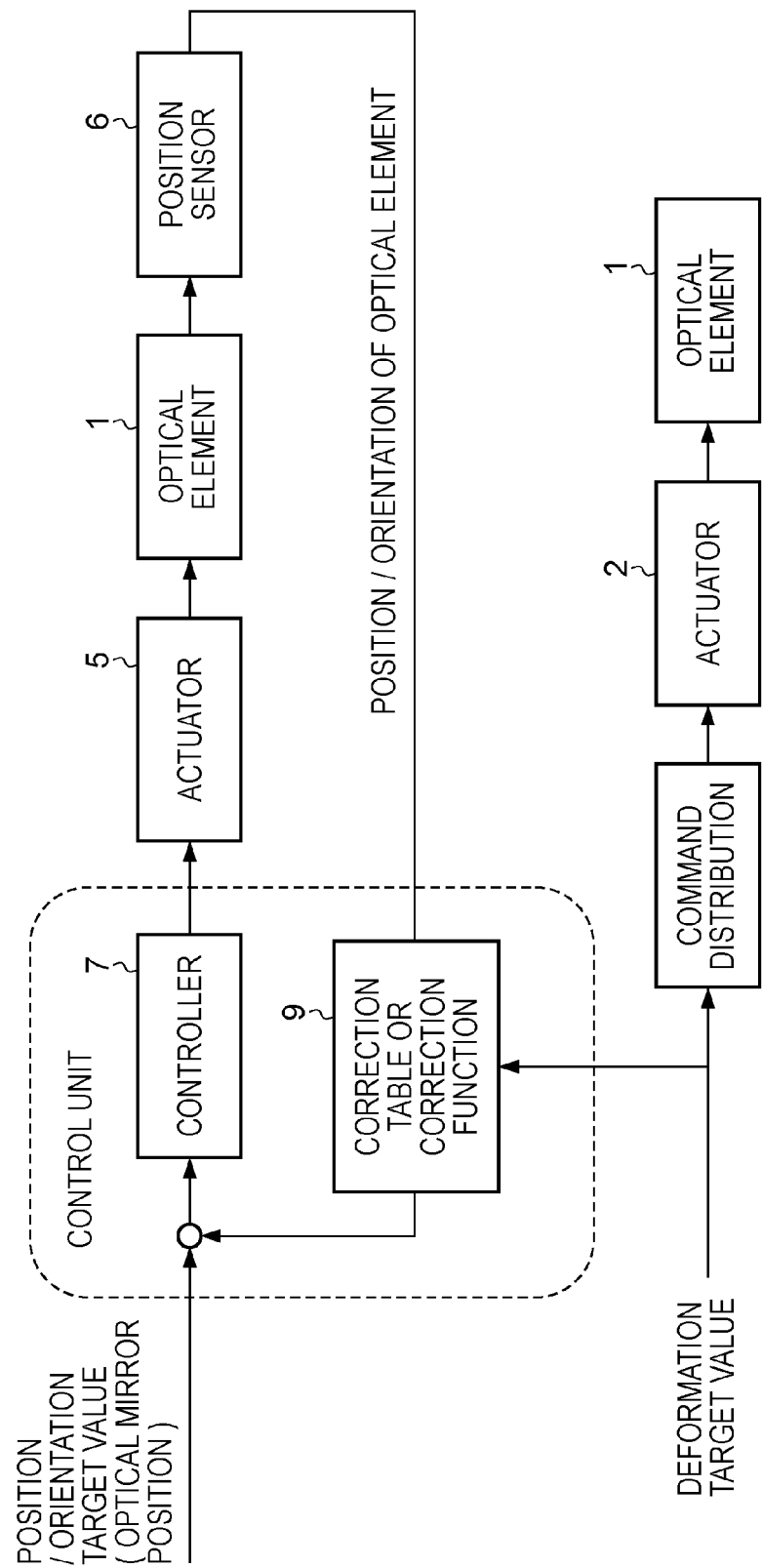
FIG. 5 shows a modification of the block diagram of the control system in the optical element driving apparatus according to the first exemplary embodiment.

FIG. 5 shows a modification of the block diagram of the control system in the optical element driving apparatus. In this modification, a correction table or a correction function is employed to correct the measured value of the position sensor with respect to the input deformation target value instead of the deformation model and the solver. The correction table or the correction function can be decided by previously obtaining a displacement of the measurement point of the position sensor with respect to the deformation target value off-line by using the deformation model and the solver. The correction function used herein can be, for example, a rigid matrix which can be obtained by solving the finite element model of the optical element using the finite element analysis solver and which represents conversion from the force generated by the deforming actuator to the displacement of the measurement point of the position sensor. Using the rigid matrix is useful in enabling the correction amount to be obtained by a simple matrix operation and enabling the measured value of the position sensor to be corrected with a less amount of calculations than that in the case of an operation using the solver.

Figure 6:
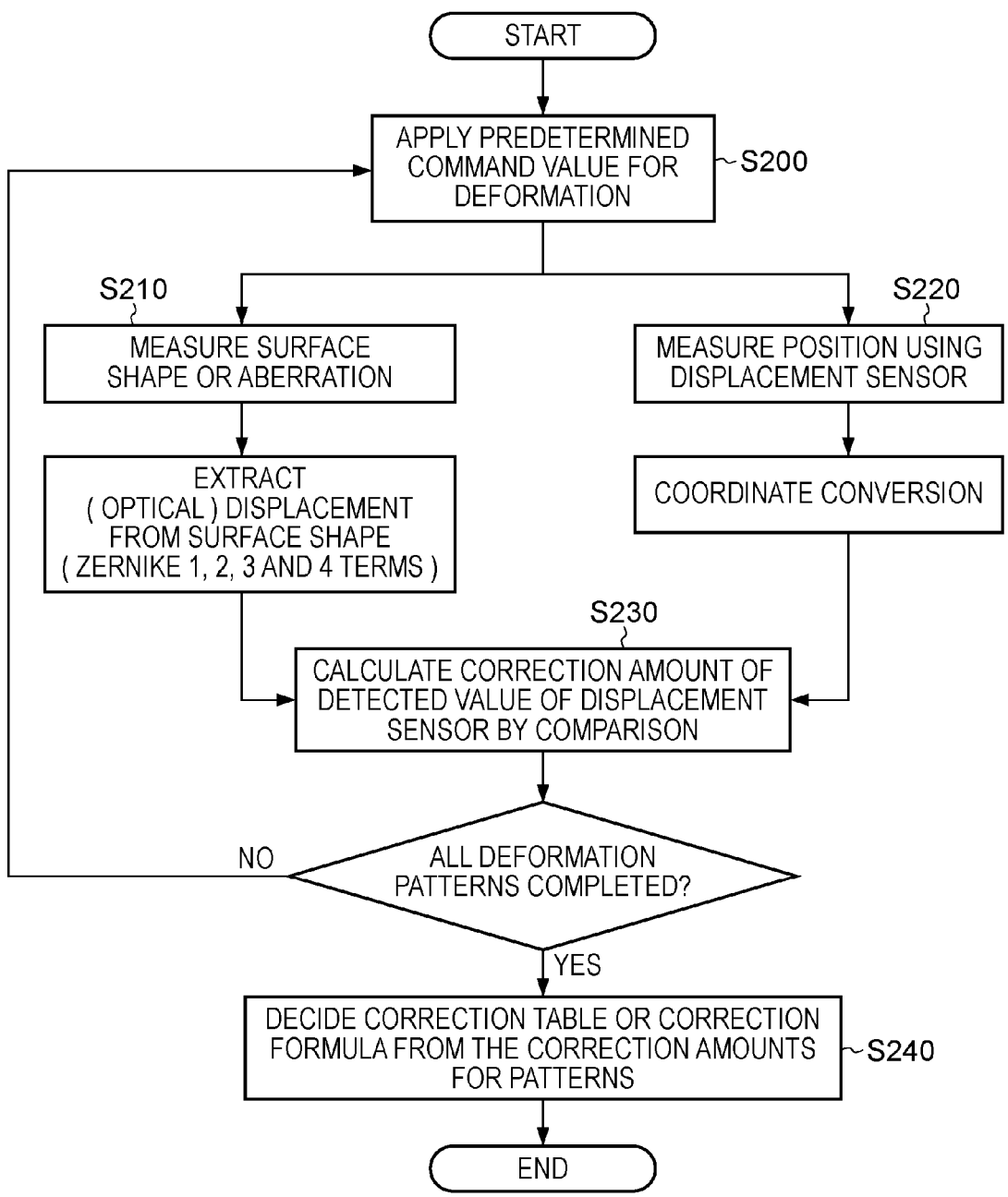
FIG. 6 is a flowchart for a correction table decision procedure in the optical element driving apparatus according to the first exemplary embodiment.

Alternatively, the correction table or the correction function can also be decided from the result obtained by measuring the surface shape or the aberration of the optical element 1 in the deformed state with the surface shape measuring device or the wave-front aberration measuring device. FIG. 6 is a flowchart for a correction-table and correction-function decision procedure in the optical element driving apparatus. First, a predetermined deformation target value is applied to the optical element driving apparatus (S200), and the surface shape or the aberration of the optical element in that state is measured using the surface shape measuring device or the wave-front aberration measuring device (S210). At the same time, a displacement of the measurement point of the position sensor is measured using the position sensor 6 (S220). The surface shape or the aberration of an optical element is usually evaluated using an orthogonal function system called a Zernike polynomial. In particular, first to fourth terms of the Zernike polynomial are called "piston", "tilt", and "focus", and they represent an optical displacement and change in the radius of curvature. By comparing the optical displacement obtained from the result of measuring the surface shape or the wave-front aberration with the displacement obtained from the measured value of the position sensor (S230), therefore, a correction amount of the measured value of the position sensor can be obtained. By repeating the above-described steps for all of shape patterns corresponding to scheduled deformations of the optical element, the correction table or the correction function can be decided (S240) for all the deformation patterns.

Figure 10:
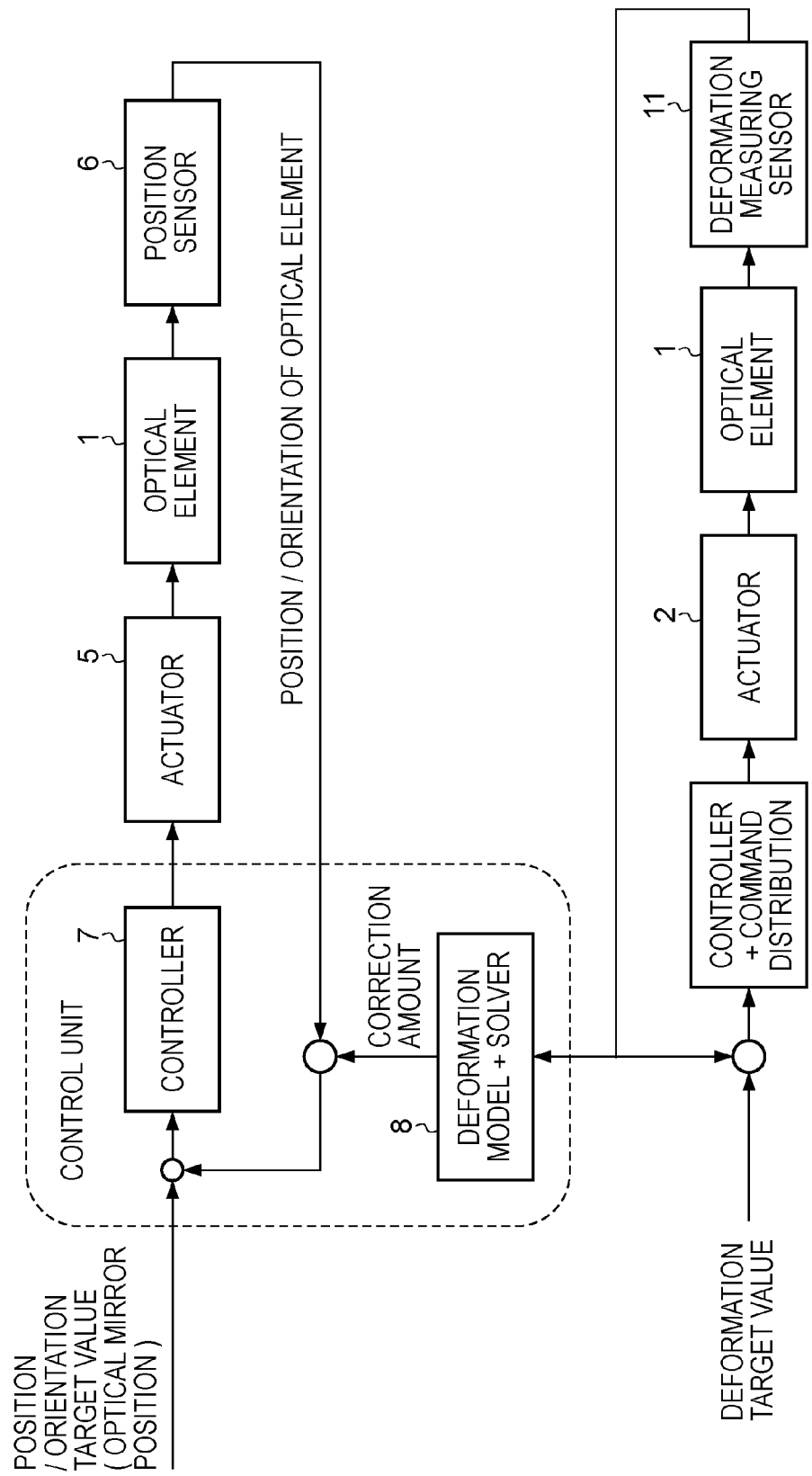
FIG. 10 shows a modification of the block diagram of the control system in the optical element driving apparatus according to the first exemplary embodiment.

While the above description has been made as correcting the measured value of the position sensor based on the deformation target value, the measured value of the position sensor can also be corrected based on an amount of deformation measured by a deformation measuring sensor. FIG. 10 shows a block diagram of a control system in such a case. The deformation measuring sensor can be constituted by the shape measuring device or the wave-front aberration measuring device. As an alternative, other displacement sensors, such as electrostatic capacitance sensors, interferometers, or encoders, can also be used to measure displacements at plural points on the optical element. The displacement sensors have to be arranged not to locate within a light-beam effective range of the optical element. When the optical element is a mirror, the displacement sensors can be arranged on the backside of the mirror.

Further, the amount of deformation measured by each of those deformation measuring sensors can also be used to control the amount of deformation. In that case, a command value is computed by the controller and is distributed to each actuator so that the difference between the deformation target value and the amount of measured deformation is zero.

According to this first exemplary embodiment, as described above, since the measured value of the position sensor is corrected depending on the deformation state, an error caused by deformation can be removed from the measured value of the position sensor, and positioning of the optical element can be realized with high accuracy.

Second Exemplary Embodiment

Figure 7:
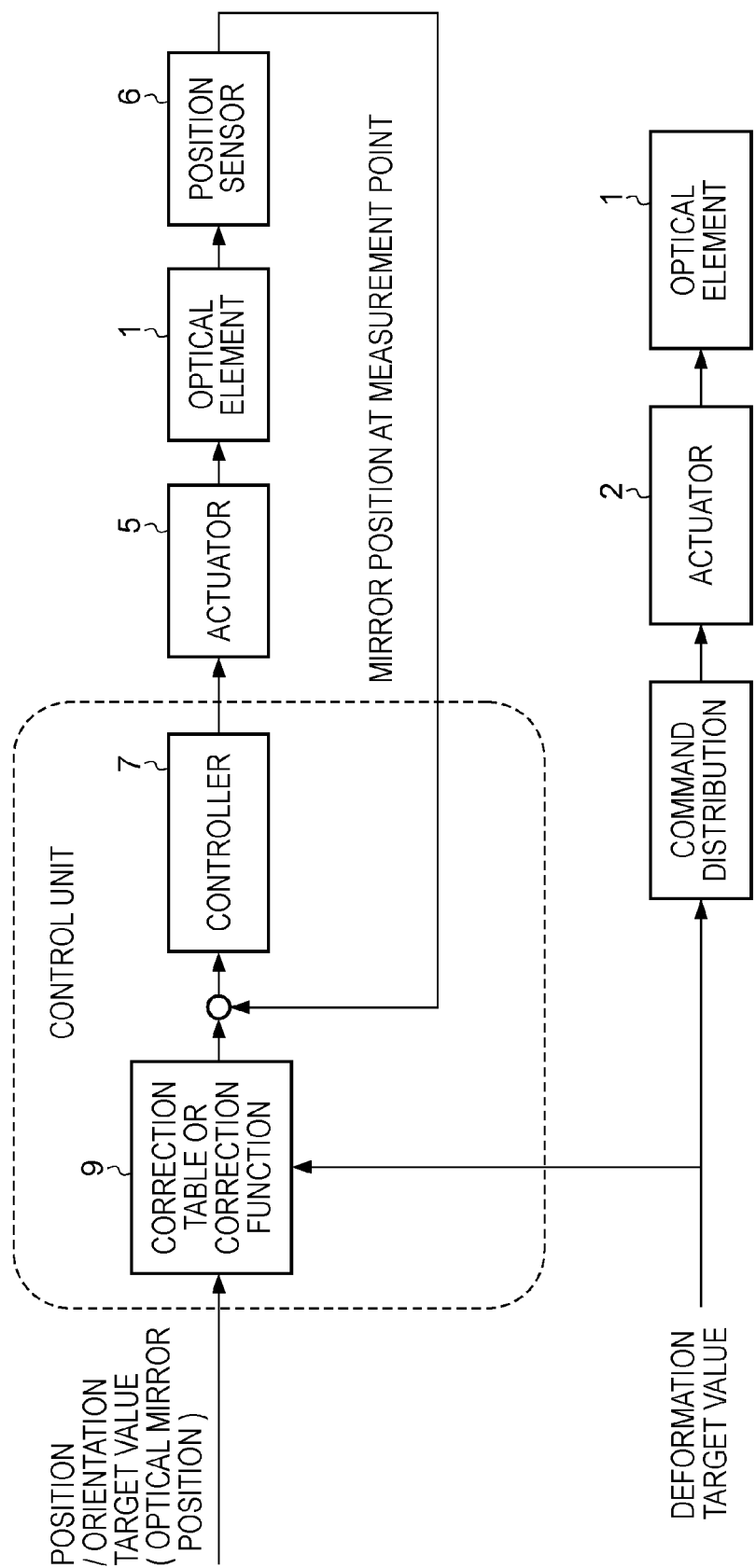
FIG. 7 is a block diagram of a control system in an optical element driving apparatus according to a second exemplary embodiment.

FIG. 7 is a block diagram of a control system in an optical element driving apparatus according to a second exemplary embodiment. This second exemplary embodiment differs from the first exemplary embodiment in that the correction of the influence of deformation is made on the position/orientation target value instead of the measured value of the position sensor. Note that constructions and methods which are not specifically explained in the following description of this second exemplary embodiment are the same as those in the first exemplary embodiment. For example, while FIG. 7 shows the correction method using the correction table or the correction function, the method using the deformation model and the solver can also be similarly used.

In this second exemplary embodiment, because the correction is made on the position/orientation target value, a correction process is executed when the position/orientation target value is changed, or only when the deformation target value is changed. Accordingly, the correction can be performed with a less amount of calculations than that in the first exemplary embodiment which requires the measured value of the position sensor to be corrected whenever the optical element is deformed.

An optical element driving method executed by the above-described control system includes a step of computing, based on the deformation target value, an amount of displacement of the sensor measurement point caused by the deformation of the optical element. The optical element driving method further includes a step of correcting the position/orientation target value of the optical element based on the calculated amount of displacement, and a step of controlling a driving mechanism which positions the optical element using the corrected value.

Third Exemplary Embodiment

Figure 8:
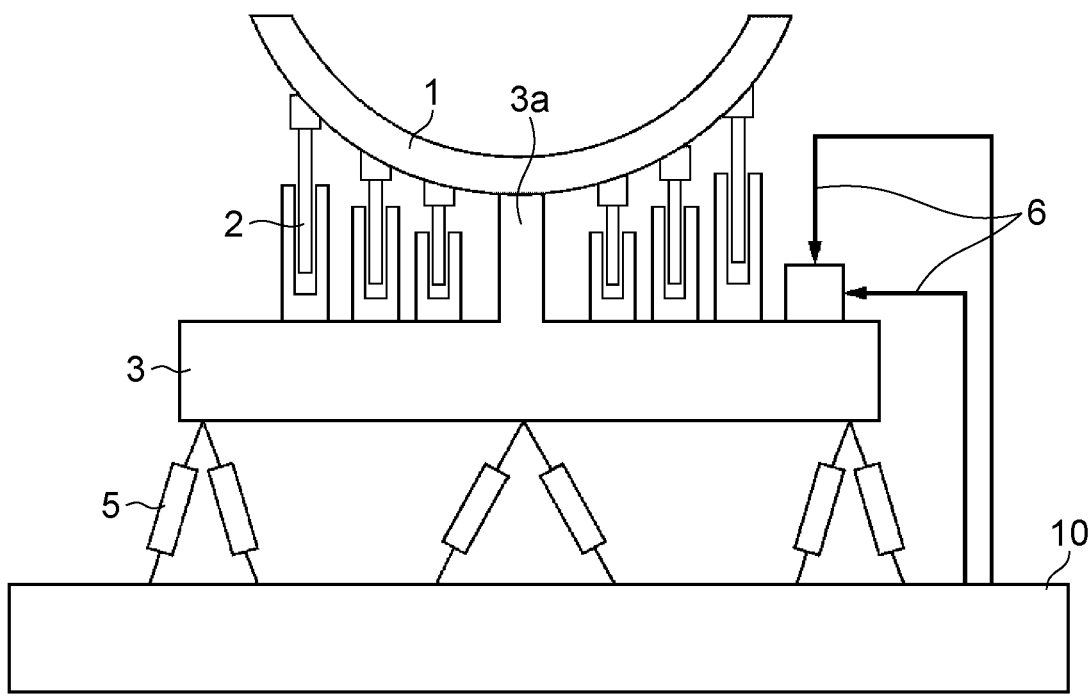
FIG. 8 is a schematic view of an optical element driving apparatus according to a third exemplary embodiment.

FIG. 8 is a schematic view of an optical element driving apparatus according to a third exemplary embodiment of the present invention. Referring to FIG. 8, actuators 2 are supported by a supporting member 3, and the actuators 2 and other actuators 5 are arranged in series. Note that constructions and methods which are not specifically explained in the following description of this third exemplary embodiment are the same as those in the first exemplary embodiment. Also, the same components as those in FIG. 1 are denoted by the same reference numerals.

In the illustrated construction, an optical element 1 is deformed into an arbitrary shape in a non-contact manner by a plurality of actuators 2 which are mounted to the supporting member 3. A plurality of actuators 5 are supported by a supporting member 10 having a reference surface. Correction is performed based on the result measured by a position sensor 6. In FIG. 8, the position sensor 6 measures the supporting member 3. As an alternative, it can also directly measure the optical element 1. Further, the optical element 1 can be supported at an arbitrary point by a support portion 3a of the supporting member 3 as shown in FIG. 8. Other suitable supporting mechanism can also be used. Examples of the suitable supporting mechanism include a magnetic levitation actuator and a pneumatic actuator with weak rigidity.

As illustrated in this third exemplary embodiment, the position sensor 6 is not necessarily required to measure the optical element 1 itself so long as the position sensor 6 is able to measure a movable member which is driven by the actuators 5 substantially integrally with the optical element 1. Even in such a case, the measured value of the position sensor or the position/orientation target value can also be corrected in the same manner as in the first and second exemplary embodiments. As a result, the degree of freedom in arrangement of the position sensor 6 can be increased even when a space for arranging the position sensor around the optical element and the optical element cannot be directly measured.

Fourth Exemplary Embodiment

Figure 9:
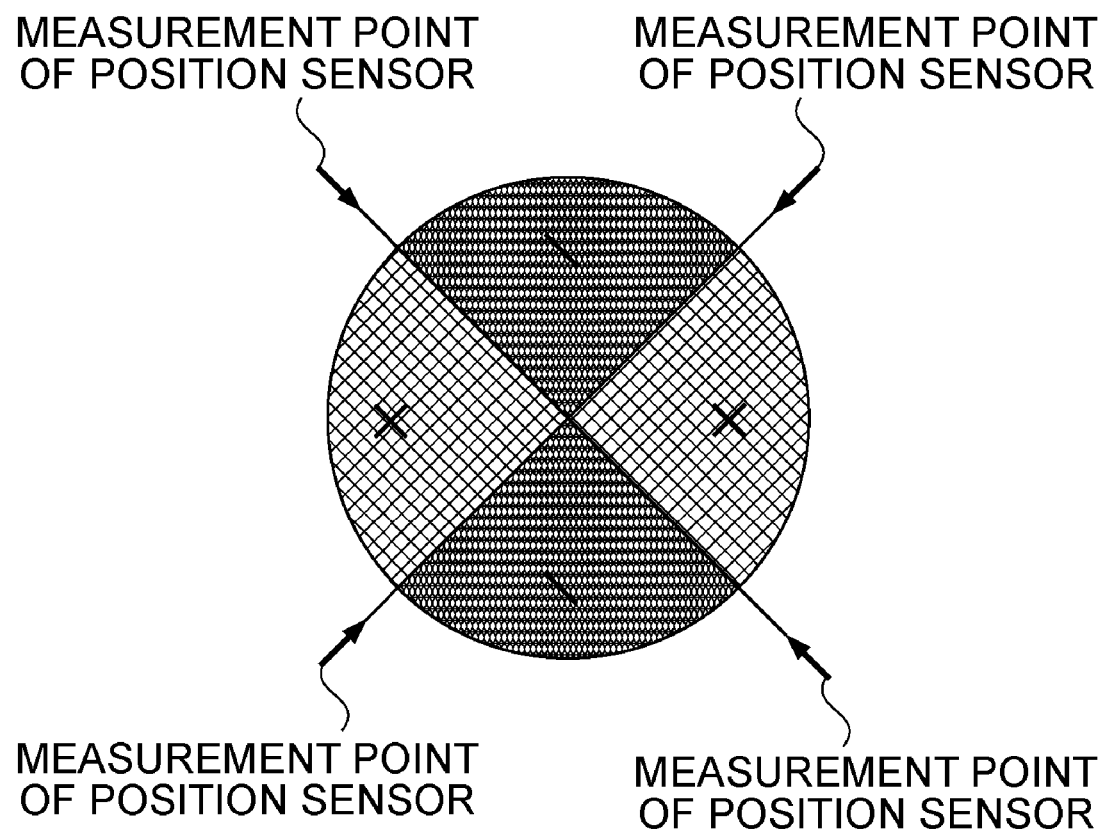
FIG. 9 is a schematic plan view of an optical element modified into a cos 2θ-shape according to a fourth exemplary embodiment, the view showing one example of arrangement of measurement points of position sensors corresponding to the cos 2θ-shape.

FIG. 9 is an illustration for explaining a fourth exemplary embodiment. Note that constructions and methods which are not specifically explained in the following description of this fourth exemplary embodiment are the same as those in the first and third exemplary embodiments. In this fourth exemplary embodiment, a position where the influence of deformation of the optical element is small is determined in advance, and the measurement point of the position sensor is set at that position or the vicinity of that position. Because it can be very difficult to determine the position for all of the deformed shapes where the influence of deformation is small, the deformed shapes can be limited to some extent.

More specifically, FIG. 9 shows the deformed shapes of the optical element 1 in a plan view. In this fourth exemplary embodiment, the deformed shapes are limited to shapes of Z5, Z12, Z21 and Z32 each having a term of $\cos 2\theta$ in the Zernike polynomial. In each of those shapes of Z5, Z12, Z21 and Z32, a displacement is maximized on the X-axis or the Y-axis. In the term of Z5, as shown in FIG. 9, an area (+) on the X-axis is convexly deformed, and an area (−) on the Y-axis is concavely deformed. On the other hand, deformation does not occur on each of lines corresponding to 45 degrees. Also, in shapes which are obtained by combinations of Z5, Z12, Z21 and Z32 each having a term of $\cos 2\theta$, deformation does not occur on each of the lines corresponding to 45 degrees. By arranging the measurement point of the position sensor on any of those lines, the position and the orientation of the optical element can be measured without being affected by deformation. In addition to the term in the Zernike polynomial illustrated in FIG. 9, there are also places where no deformation occurs. Stated another way, the position and the orientation of the optical element can be measured without being affected by deformation by deciding arrangement of the measurement point of the position sensor with respect to a shape that is represented by the Zernike polynomial and is scheduled to be deformed. It is also possible to arrange many position sensors and to selectively use one or more of those position sensors, which are arranged in the places not subjected to the influence of deformation, depending on the deformed shape.

The shape of an actually used optical element is not simple because it includes actuators, etc. Therefore, the place not subjected to the influence of deformation can be accurately decided by using the deformation model or by measuring the surface shape or the wave-front aberration of the optical element as in the first and second exemplary embodiments.

Although this fourth exemplary embodiment can be practiced in combination with the method of correcting the measured value of the position sensor and/or the position/orientation target value as in the first and second exemplary embodiments, the fourth exemplary embodiment can be performed without correcting the measured value and/or the target value. Whether to practice this fourth exemplary embodiment alone or in combination can be decided, taking into account the demanded positioning accuracy, for example. In order to eliminate the necessity of the correction, one can select, as the measurement point of the position sensor, the place where the influence of deformation at the measurement point of the position sensor is sufficiently less than a value demanded for position/orientation accuracy of the optical element. For example, when the value demanded for the positioning accuracy is 1 nm, a measurement error of the position sensor caused by the influence of deformation is should be 0.5 nm or less.

According to this fourth exemplary embodiment, although the deformed shape is restricted and the measurement point of the position sensor can be arranged in conformity with the deformed shape, the optical element 1 can be positioned in match with the predetermined position/orientation target value with a simple construction and high accuracy without correcting the measured value of the position sensor.

Exemplary Embodiment for Application to Exposure Apparatus

Figure 11:
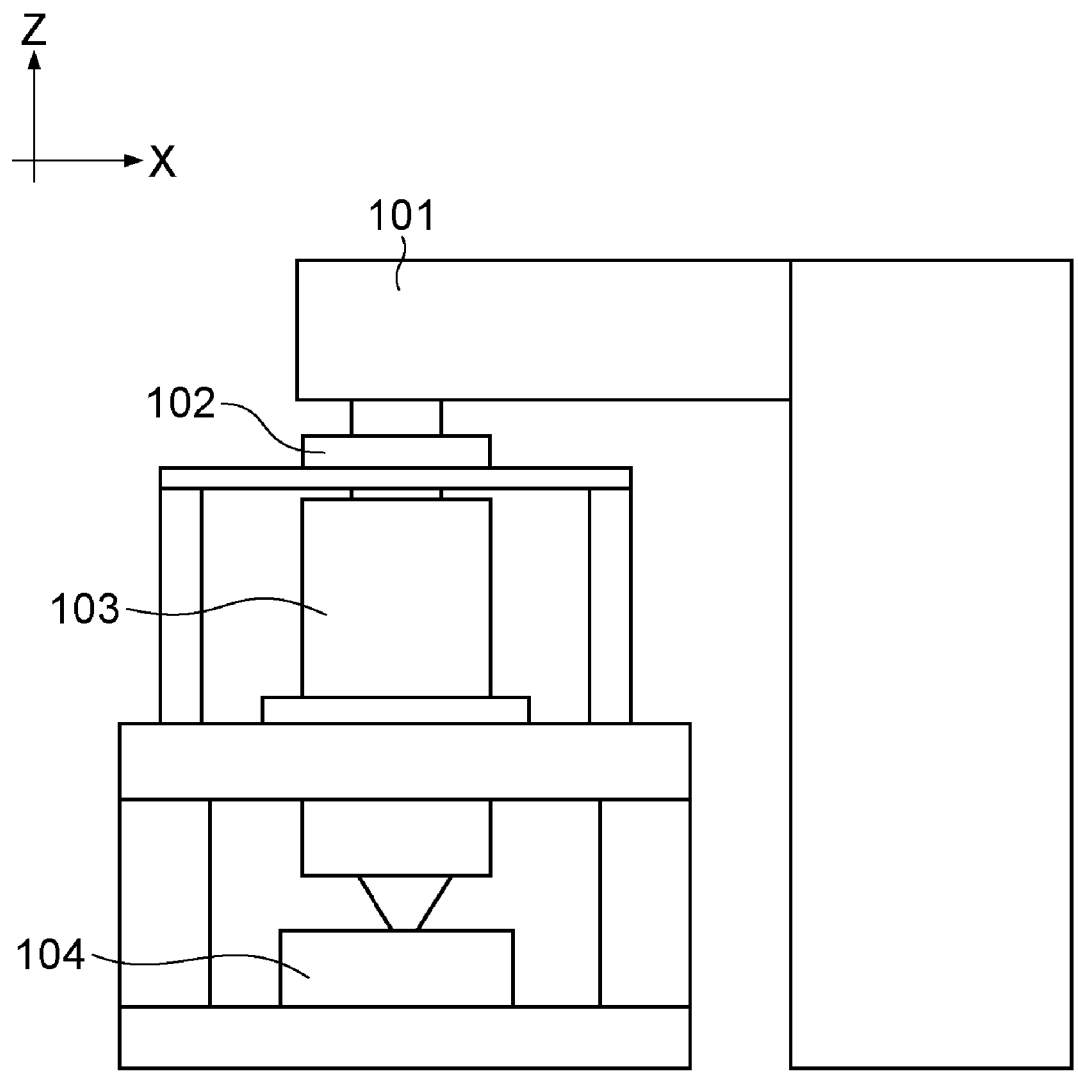
FIG. 11 is a schematic view for explaining an exposure apparatus.

One example of an exposure apparatus to which is applied the optical element driving apparatus of the present invention will be described below. As shown in FIG. 11, the exposure apparatus comprises an illumination apparatus 101, a reticle stage 102 on which is mounted a reticle, a projection optical system 103, and a wafer stage 104 on which is mounted a wafer. The exposure apparatus projects a circuit pattern formed on the reticle onto the wafer with an exposure light. The exposure apparatus can be of the step-and-repeat projection and exposure type or the step-and-scan projection and exposure type.

The illumination apparatus 101 illuminates the reticle 20 on which is formed the circuit pattern. The illumination apparatus 10 comprises a light source unit and an illumination optical system. In the light source unit, a light is constituted by, for example, a laser. Non-limiting examples of the laser that can be used include an ArF excimer laser with a wavelength of about 193 nm, a KrF excimer laser with a wavelength of about 248 nm, and an $F_2$ excimer laser with a wavelength of about 153 nm. The type of the laser is not limited to the excimer laser, and a YAG laser can also be used. Further, the number of lasers used is not limited to a particular number. When the laser is used as the light source, the light source unit can include a laser-beam shaping optical system for shaping a parallel laser beam from the laser source into a desired beam shape, and an incoherent-beam producing optical system for converting a coherent laser beam to an incoherent beam. In addition, the light source usable in the light source unit is not limited to the laser, and one or plural lamps, such as mercury lamps or xenon lamps, can also be used.

The illumination optical system 103 serves as an optical system for illuminating the reticle (mask), and it includes a lens, a mirror, a light integrator, an aperture, etc.

The projection optical system can be constituted by, for example, an optical system including a plurality of lens elements and at least one concave mirror (i.e., a catadioptric optical system), or an all-mirror optical system. The above-described optical element driving apparatus can be used as an apparatus for driving the concave mirror or the other mirror.

The reticle stage 102 and the wafer stage 104 can be each moved by a linear motor, for example. In the exposure apparatus of the step-and-scan projection and exposure type, the stages 102 and 104 are moved in a sync relation. Further, an additional actuator is provided on at least one of the wafer stage and the reticle stage for registration of the circuit pattern on the reticle with respect to the wafer.

The above-described exposure apparatus can be utilized to manufacture a semiconductor device such as a semiconductor integrated circuit, and a device formed with fine patterns, such as a micromachine or a thin film magnetic head.

Figure 12:
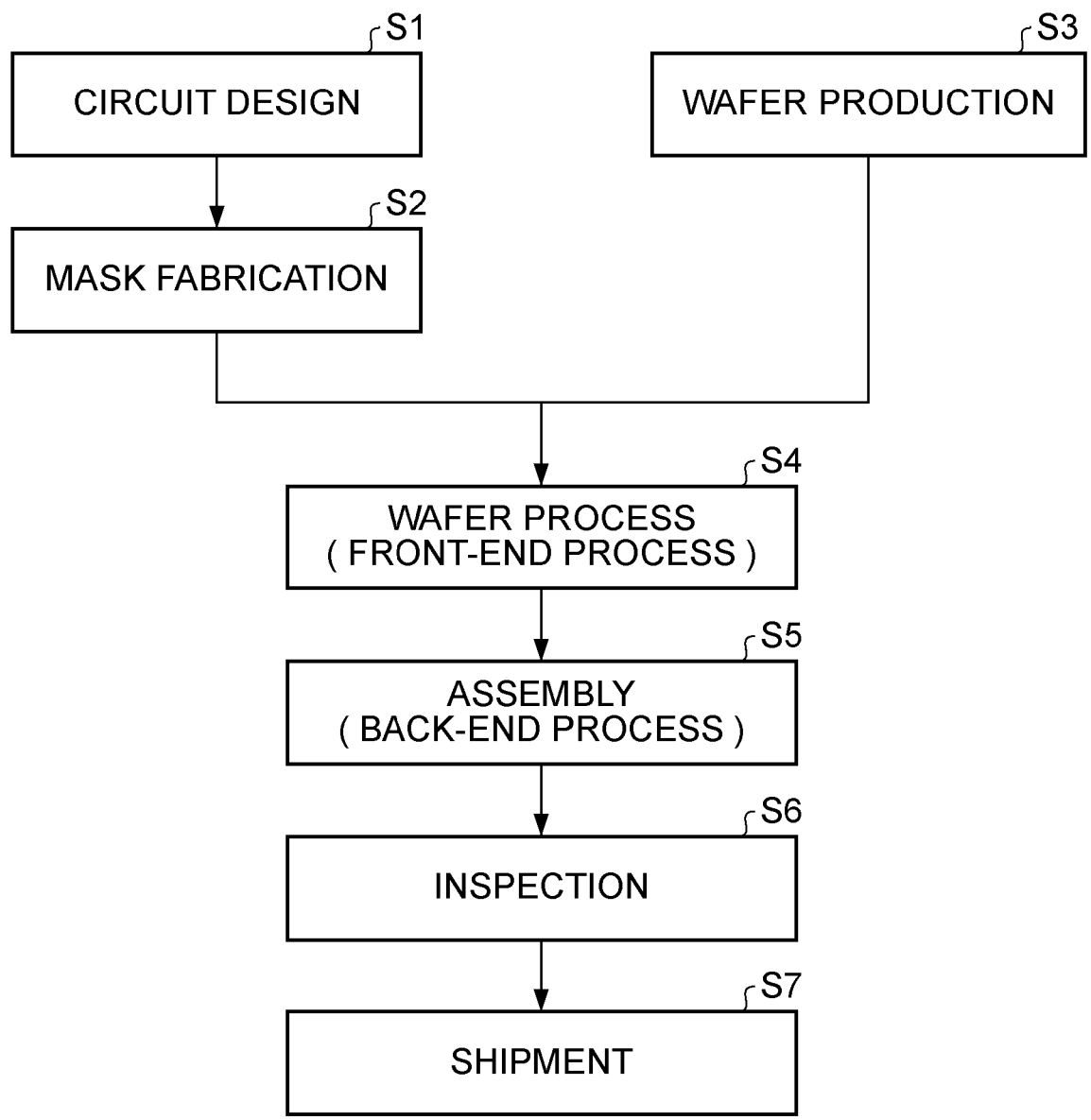
FIG. 12 is a block diagram for explaining a device manufacturing method.

An example of a method for manufacturing a device by the above-described exposure apparatus will be described below with reference to FIGS. 12 and 13. FIG. 12 is a flowchart for explaining the manufacturing of a device (e.g., a semiconductor device such as an IC or an LSI, an LCD, and a CCD). The following description is made, by way of example, of the manufacturing of a semiconductor device.

In step S1 (circuit design), circuit design of the semiconductor device is performed. In step S2 (mask fabrication), a mask is fabricated in accordance with a designed circuit pattern. In step S3 (wafer manufacturing), a wafer is manufactured by using silicon or other suitable material. In step S4 (wafer process), which is also called a front-end process, an actual circuit is formed on the wafer by the above-described exposure apparatus with the lithography technique using the mask and the wafer. In step S5 (assembly), which is also called a back-end process, a semiconductor chip is manufactured using the wafer formed in step S4. The back-end process includes steps for assembling, i.e., an assembly step (dicing and bonding), a packaging step (chip encapsulation), and so on. In step S6 (inspection), inspection including an operation check test, a durability test, etc. is made on the semiconductor device manufactured in step S5. A semiconductor device is completed through the above-described steps and is shipped (step S7).

Figure 13:
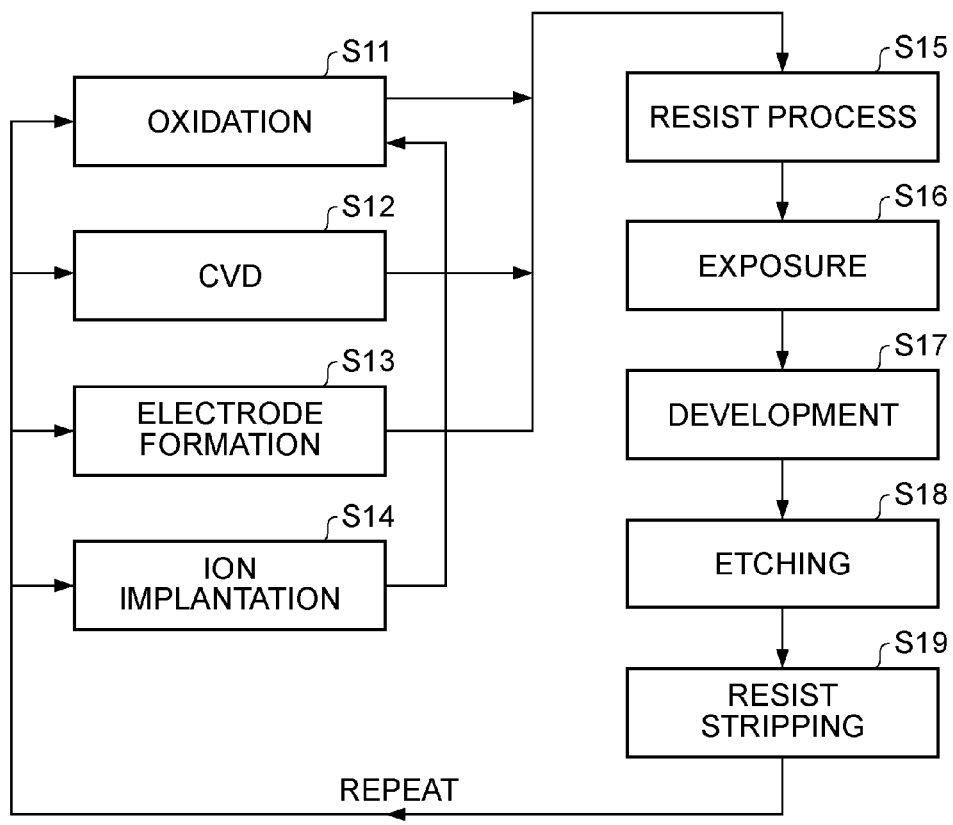
FIG. 13 is a block diagram for explaining a wafer process.
Figure 14:
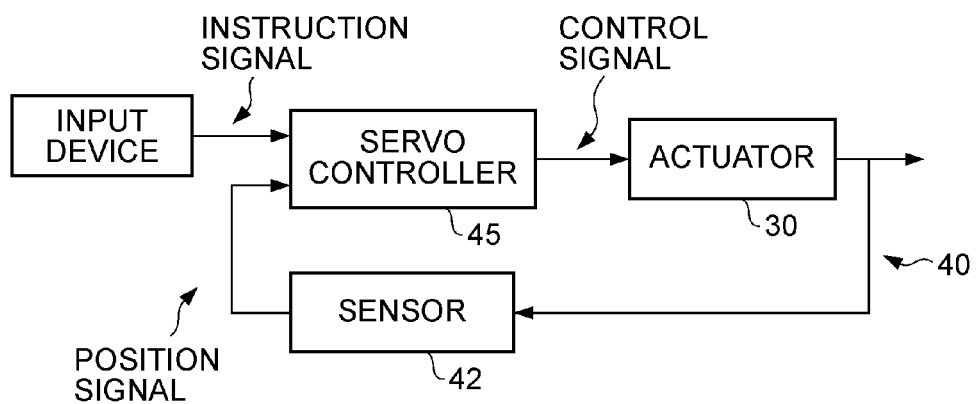
FIG. 14 is a block diagram of a control system in a known optical element driving apparatus.

FIG. 13 is a detailed flowchart of the wafer process in step S4. In step S11 (oxidation), the wafer surface is oxidized. In step S12 (CVD), an insulation film is formed on the wafer surface. In step S13 (electrode formation), electrodes are formed on the wafer by vapor deposition. In step S14 (ion implantation), ions are implanted into the wafer. In step S15 (resist process), a photoresist is coated on the wafer. In step S16 (exposure), the circuit pattern on the mask is projected onto the wafer with an exposure light by using the exposure apparatus. In step S17 (development), the exposed wafer is developed. In step S18 (etching), the wafer is etched in area other than the developed resist image. In step S19 (resist stripping), the resist, which is not required any more after the etching, is removed. By repeatedly performing the above-mentioned steps, the circuit pattern is formed on the wafer in a multiple way.

While the present invention has been described with reference to exemplary embodiments, it is to be understood that the invention is not limited to the discussed exemplary embodiments. The scope of the following claims is to be accorded the broadest interpretation so as to encompass all modifications, equivalent structures and functions.

This application claims the benefit of Japanese Patent Application No. 2006-142721 filed May 23, 2006, which is hereby incorporated by reference herein in its entirety.

What is claimed is:

1. An optical element driving apparatus configured to drive an optical element, the apparatus including:
    a first actuator configured to drive the optical element in accordance with a deformation target value;
    a sensor arranged to measure a position and an orientation of the optical element via a measurement point on a non-illuminated surface of the optical element;
    a second actuator configured to drive the optical element in accordance with a position and an orientation target values and an output of the sensor; and
    a correcting unit configured to correct a measurement error of at least one of the position and orientation of the optical element caused by deformation of the optical element.

2. The optical element driving apparatus according to claim 1, wherein the correcting unit calculates an amount of displacement of a measurement point of the sensor corresponding to the deformation target value, and adds the calculated result to at least one of the position target value, the orientation target value, and the output of the sensor.

3. The optical element driving apparatus according to claim 1, wherein the correcting unit calculates an amount of displacement of a measurement point of the sensor corresponding to the deformation target value by using a previously-prepared deformation model of the optical element, and corrects the measurement error of the sensor based on the calculated amount of displacement.

4. The optical element driving apparatus according to claim 1, wherein the correcting unit includes at least one of a correction table and a correction function which represents a relationship between the deformation target value and an amount of displacement of the measurement point of the sensor, and corrects the measurement error of the sensor based on at least one of the correction table and the correction function.

5. The optical element driving apparatus according to claim 4, wherein at least one of the correction table and the correction function is obtained using a deformation model of the optical element.

6. The optical element driving apparatus according to claim 4, wherein at least one of the correction table and the correction function is obtained by comparing a result of measuring the optical element by at least one of an aberration measuring device and a surface shape measuring device with a measured result of the sensor.

7. An exposure apparatus including:
    a projection optical system, which includes an optical element driving apparatus according to claim 1.

* * * * *